US006876064B2

(12) United States Patent
Matumoto et al.

(10) Patent No.: US 6,876,064 B2
(45) Date of Patent: Apr. 5, 2005

(54) SEMICONDUCTOR DEVICE HAVING SUPERIOR RESISTANCE TO MOISTURE

(75) Inventors: Akira Matumoto, Kawasaki (JP);
Tadashi Fukase, Kawasaki (JP);
Manabu Iguchi, Kawasaki (JP);
Masahiro Komuro, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/753,326

(22) Filed: Jan. 9, 2004

(65) Prior Publication Data

US 2004/0150073 A1 Aug. 5, 2004

(30) Foreign Application Priority Data

Jan. 30, 2003 (JP) ........................................ 2003-022768
Sep. 17, 2003 (JP) ........................................ 2003-324210

(51) Int. Cl.[7] ............................................. H01L 23/58
(52) U.S. Cl. ...................... 257/632; 257/660; 257/620; 257/662; 257/758; 257/211
(58) Field of Search ................................. 257/659, 660, 257/662, 620, 484, 758, 211, 632

(56) References Cited

U.S. PATENT DOCUMENTS

| 6,100,589 A | * | 8/2000 | Tanaka ........................ 257/758 |
| 6,365,958 B1 | * | 4/2002 | Ibnabdeljalil et al. ....... 257/620 |
| 6,670,710 B2 | * | 12/2003 | Matsunaga ................... 257/758 |
| 2003/0218254 A1 | * | 11/2003 | Kurimoto et al. ........... 257/758 |

FOREIGN PATENT DOCUMENTS

| JP | 5-259112 A | 10/1993 |
| JP | 2000-150429 A | 5/2000 |
| JP | 2000-299354 A | 10/2000 |
| JP | 2001-60567 A | 3/2001 |
| JP | 2001-110813 A | 4/2001 |
| JP | 2002-26008 A | 1/2002 |
| JP | 2002-231854 A | 8/2002 |

* cited by examiner

Primary Examiner—Thanh Nguyen
(74) Attorney, Agent, or Firm—Sughrue Mion, PLLC

(57) ABSTRACT

In a semiconductor device, a circuit unit is formed in an inside portion, and seal rings that enclose the inside portion that are composed of walls of metal layers are formed around the periphery. In the corners, the seal rings include linear parts that extend inwardly in addition to the linear parts that extend along the periphery, whereby the seal rings are formed in a planar pattern having small rectangular planar patterns in each corner.

14 Claims, 4 Drawing Sheets

SEMICONDUCTOR DEVICE HAVING SUPERIOR RESISTANCE TO MOISTURE

BACKGROUND OF THE INVENTION

1. Field of the Invention

The present invention relates to the construction of a semiconductor device; and more particularly to the construction of walls that are impermeable to moisture (these walls being referred to hereinbelow as "seal rings") that are provided as a single unit, that penetrate each of a plurality of interlayer dielectric films provided on a semiconductor substrate, and that are provided around the periphery of a semiconductor chip so as to enclose the inside portion of the semiconductor chip.

2. Description of the Related Art

In the process of fabricating a semiconductor device, after carrying out prescribed processes in the wafer state, the wafers are diced to chip size to obtain each semiconductor chip. A major issue in the fabrication of semiconductor devices is the prevention of moisture in the atmosphere or during dicing from permeating the cross section of the diced chips and thereby degrading the performance of the internal devices.

For this purpose, a method is known in which the outer periphery of a chip is covered by a metal pattern that is commonly referred to as a seal ring. The metal layer that functions as this seal ring is normally formed at the same time as the internal wiring patterns of the chip. In the prior art, this type of seal ring 2 is formed by a simple rectangular pattern that surrounds the outer perimeter of the chip, as shown in FIG. 1. Seal ring 2 is therefore formed with pointed shapes directed outward from the chip in the corners (as an example, refer to pages 3–5 and FIG. 3 of Japanese Patent Laid-Open Publication No. 2000-150429).

Typically, when the chip is exposed to a heat cycle, stress tends to concentrate in the corners of the chip, and the corners of the chip are therefore vulnerable to cracking. At this time, in a semiconductor chip in which seal ring 2 is formed in the above-described simple rectangular shape, there is a potential for cracking to occur in the corners in the areas inside seal ring 2. In such cases, moisture may enter the chip interior from the cracked portions, and the function of seal ring 2, which is to prevent the penetration of moisture, cannot be adequately achieved.

As a construction for suppressing the occurrence of this problem, one example is known in which seal ring 2 is arranged to extend at a 45° angle with respect to each side of the chip in the corners, as shown in FIG. 2. By means of this arrangement, seal ring 2 is positioned more toward the inside in the corners than in the rectangular pattern. As a result, this construction provides some effect, which is to allow a certain increase in resistance against moisture with regard to the intrusion of moisture into the chip interior that is caused by the occurrence of cracking in the corners of the chip.

Employing a plurality of seal rings similarly obtains the effect of suppressing the loss of the function of the seal ring due to the occurrence of cracking.

However, in the interest of extending the region of the chip that can be effectively used, the seal ring is preferably arranged as far toward the outside as possible. In a seal ring construction in which the seal ring is simply positioned inwardly in the corners as described above, the seal ring must also be arranged more toward the interior of the chip in areas other than the corners in order to prevent the effect of cracking in the corners. As a result, the area of the chip that can be effectively used is limited.

Further, a construction in which the number of seal rings is simply increased in some cases does not constitute an adequate countermeasure against cracking if the frequency of the occurrence of cracking in the corners and the depth of penetration are taken into consideration. In particular, semiconductor devices that employ interlayer dielectric films having a low dielectric constant that are being adopted in high integrated circuits in recent years call for an even stronger seal ring due to the degree of moisture absorption, the low degree of mechanical strength, and the low degree of adhesion to the wiring metal in the dielectric films themselves.

SUMMARY OF THE INVENTION

It is an object of the present invention to provide a semiconductor device having a seal ring construction that can improve resistance to moisture with regard to cracks in the corners.

It is another object of the present invention to provide a semiconductor device having a seal ring construction that allows an improvement in the resistance to moisture in a semiconductor device that is provided with highly integrated circuits that employ dielectric films having a low dielectric constant.

The semiconductor device of the present invention for achieving these objects is a construction that adds, to a seal ring that is conventionally formed by a simple rectangular planar pattern in a shape that surrounds the peripheral region of a semiconductor device, linear parts that extend inwardly in the corners, whereby the planar pattern further includes small rectangular planar patterns in the corners. This configuration prevents the total breakdown of the seal ring despite the occurrence of cracks caused by stress during a heat cycle that extend relatively deep into the inside area in the corners of the semiconductor device, and as a result, can reduce instances of the total loss of the functions of the enclosure constituted by the seal ring.

In addition, according to the semiconductor device of another embodiment of the present invention, the seal ring has a planar pattern in which, in peripheral areas other than the corners, the inside portion of the semiconductor device is separated from the outside by n sets (where n is an integer equal to or greater than 1) of linear parts, and in the corners, the inside portion is separated from the outside by (n+1) or more sets of linear parts. Increasing the number of seal rings that separate the inside portion from the outside in the corners in this way can greatly reduce the probability that cracks in the corners, where cracking tends to occur, will bring about the loss of the functions of the enclosure that is constituted by the seal rings.

Thus, the present invention can, by means of the function of an enclosure that is realized by seal rings, prevent the absorption of moisture by the dielectric films and thus prevent degradation of the device that is caused by the absorption of moisture even when, in particular, a film with low dielectric constant that is characterized by high moisture absorption and low mechanical strength is used as a dielectric film and even in corners where cracking tends to occur.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1:
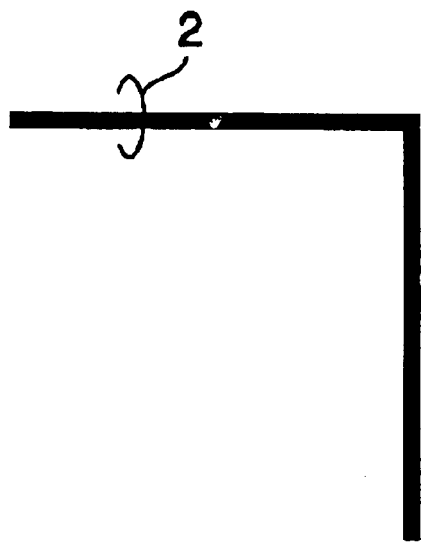
FIG. 1 is a plan view showing the construction of a seal ring of a semiconductor device of an example of the prior art.
Figure 2:
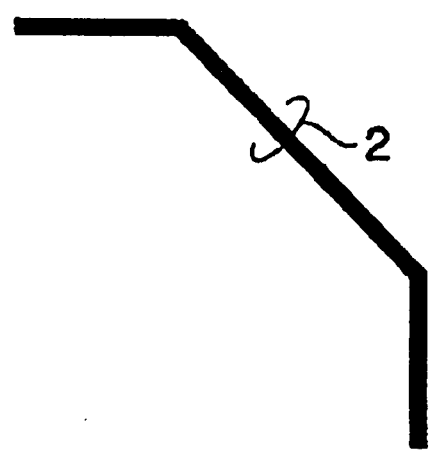
FIG. 2 is a plan view showing the construction of a seal ring of the semiconductor device of another example of the prior art.
Figure 3:
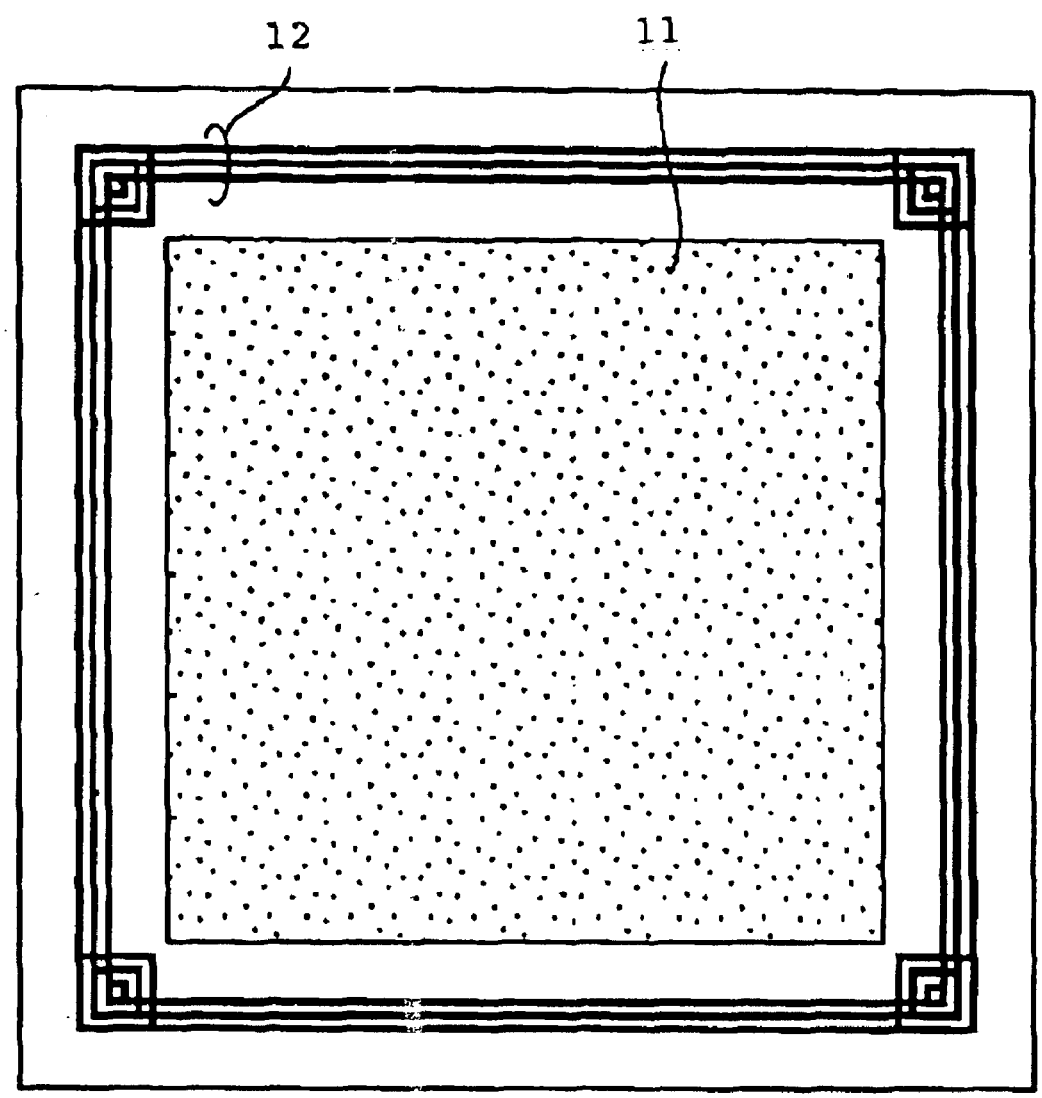
FIG. 3 is a plan view of a semiconductor device of an embodiment of the present invention.

As shown in FIG. 3, in the semiconductor device of the present embodiment, circuit unit 11 is formed within the central area, and seal ring 12 is arranged so as to surround the periphery of circuit unit 11.

Figure 5:
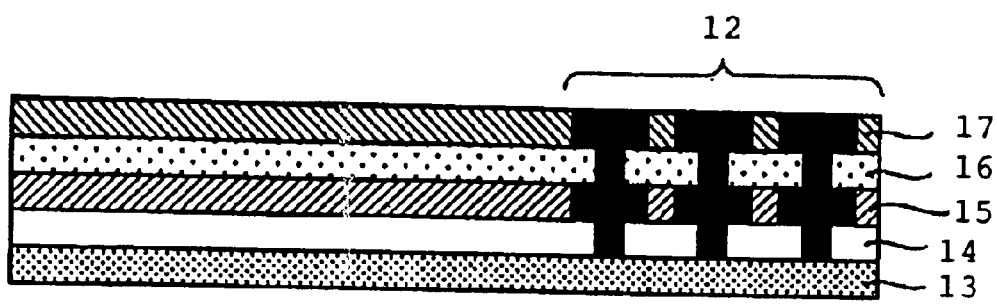
FIG. 5 is a sectional view taken along line B–B' of FIG. 4.
Figure 6:
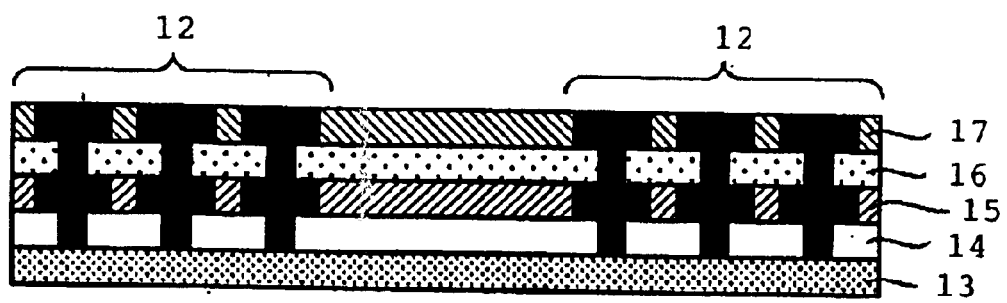
FIG. 6 is a sectional view taken along line A–A' of FIG. 4.

In the semiconductor device, dielectric film 14 that includes elements, first wiring layer dielectric film 15, first via dielectric film 16, and second wiring layer dielectric film 17 are successively stacked on silicon substrate 13, as shown in FIGS. 5 and 6. Circuit unit 11 is made up by elements, wiring, and vias (not shown in the figures) that are formed in each of these dielectric films.

Seal rings 12 are formed so as to pass through each of these dielectric films, and are composed of the same metal that is used in the wiring that is formed in each of these dielectric films. These seal rings 12 can be formed by a method that is similar to a wiring pattern formation method and are formed at the same time as the formation of the wiring pattern of the semiconductor device.

The planar pattern of seal rings 12 is a pattern in which rectangular patterns that extend so as to enclose the inside area of the device are formed in three concentric sets along the periphery of the semiconductor device. The width of each linear part of seal rings 12 that extends in rectangular form is 1 $\mu$m, and the distance between each linear part is 2 $\mu$m.

Figure 4:
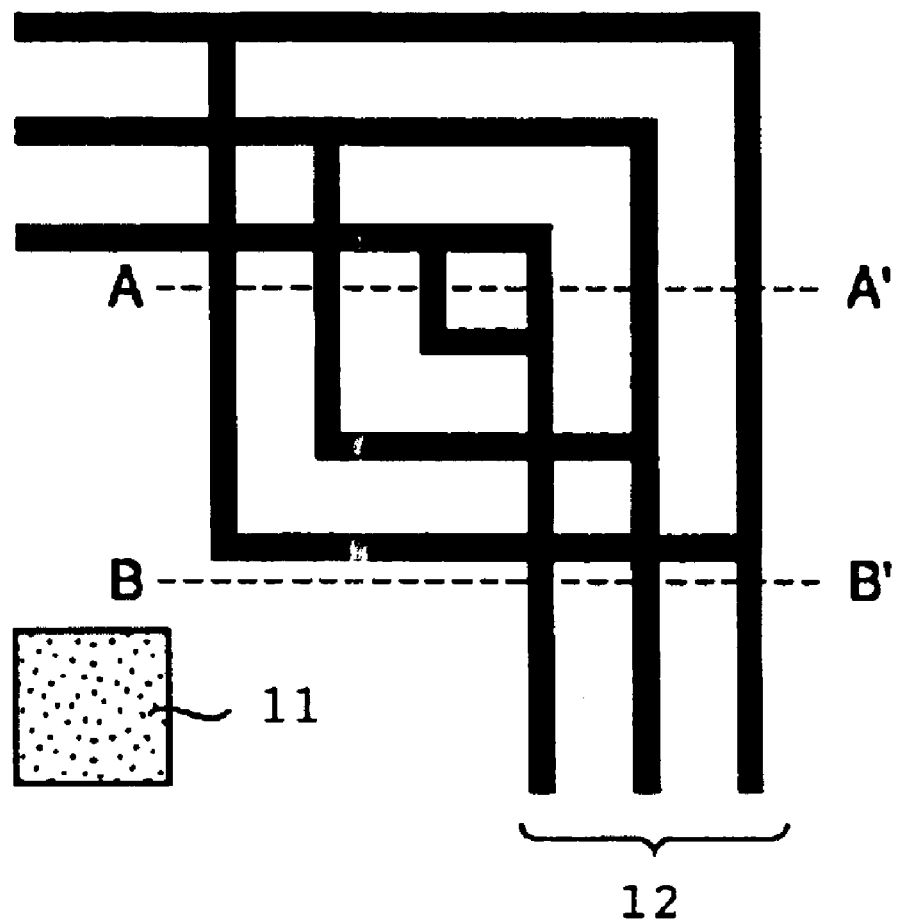
FIG. 4 is an enlarged view of a corner of the semiconductor device of FIG. 3.

As shown in detail in FIG. 4, the planar pattern of seal rings 12 in the corners of the semiconductor device further includes linear parts that extend inward. These inwardly extending linear parts and the linear parts that extend along the outer periphery form small rectangular patterns in the corners. The linear parts of the planar pattern of seal rings 12 that extend inwardly in the corners are also formed in three sets. Accordingly, the inside portion of the semiconductor device is separated from the outside by a minimum of four and a maximum of six seal rings 12 in the corners of the semiconductor device.

According to the configuration of seal rings 12 of the above-described present embodiment, not only is the number of seal rings 12 increased, but seal rings 12 are also formed extending inwardly in the corners, which is the area most prone to the occurrence of cracks due to stress. As a result, the probability of losing the function of the seal rings due to cracks can be greatly reduced.

While preferred embodiments of the present invention have been described using specific terms, such description is for illustrative purposes only, and it is to be understood that changes and variations may be made without departing from the spirit or scope of the following claims.

What is claimed is:

1. A semiconductor device, comprising
a plurality of layers of dielectric films that are formed on a substrate;
a circuit unit that is formed in said dielectric films in an inside portion of said semiconductor device; and
walls that are impermeable to moisture, that pass through each of said dielectric films, that enclose the inside portion in which said circuit unit is formed, and that are formed as a unit on an outer periphery of said semiconductor device;
wherein said walls include planar rectangular patterns in the corners of said semiconductor device, said planar rectangular patterns comprising linear parts that extend along the outer periphery and linear parts that extend inwardly.

2. A semiconductor device according to claim 1, wherein said walls have a planar pattern that encloses the inside portion of said semiconductor device and that has at least a threefold construction.

3. The semiconductor device of claim 1, wherein at least one of the layers of dielectric films defines a first plane, and the planar rectangular patterns lie within the first plane.

4. The semiconductor device of claim 1, wherein the planar rectangular patterns in the corners do not respectively surround the circuit unit.

5. The semiconductor device of claim 1, wherein the planar rectangular patterns are formed by the walls such that a line drawn from a center of the circuit unit to the outer periphery will cross a different number of walls depending upon the angle of the line with respect to the center.

6. A semiconductor device, comprising:
a plurality of layers of dielectric films that are formed on a substrate;
a circuit unit that is formed in said dielectric films in an inside portion of said semiconductor device; and
walls that are impermeable to moisture, that pass through each of said dielectric films, that enclose the inside portion in which said circuit unit is formed, and that are formed as a unit on the outer periphery of said semiconductor device;
wherein said walls have a planar pattern that, in peripheral areas of said semiconductor device other than at corners, surrounds and separates said inside portion from an outside by at least n (where n is an integer equal to or greater than 1) sets of linear parts; and in the corners, separates said inside portion from the outside by at least (n+1) sets of linear parts.

7. A semiconductor device according to claim 6, wherein said walls have a planar pattern that encloses said inside portion and that has at least a threefold construction.

8. The semiconductor device of claim 6, wherein at least one of the layers of dielectric films defines a first plane, and the planar pattern lies within the first plane.

9. The semiconductor device of claim 6, wherein each set of linear parts is made up of a plurality of walls, the walls being located in the dielectric films, wherein the walls are successively stacked in a direction perpendicular to the planar pattern.

10. The semiconductor device of claim 6, wherein the planar pattern in the corners forms at least one rectangle which does not surround the inside portion.

11. The semiconductor device of claim 6, wherein the planar patterns are arranged such that a line drawn from a center of the circuit unit to the outer periphery will cross a different number of walls depending upon the angle of the line with respect to the center.

12. A semiconductor device, comprising
a plurality of layers of dielectric films that are formed on a substrate;

a circuit unit that is formed in the dielectric films in an inside portion of the semiconductor device;

walls that are impermeable to moisture, that pass through each of the dielectric films, and that enclose the inside portion and separate the inside portion from an outer periphery;

wherein the walls form planar patterns such that a line drawn from a center of the circuit unit to the outer periphery will cross a different number of walls depending upon the angle of the line with respect to the center.

13. The semiconductor device of claim 12, wherein a first line drawn from the center crosses at least n (where n is an integer equal to or greater than 1) walls and a second line drawn from the center at a different angle from the first line crosses at least (n+1) walls.

14. The semiconductor device of claim 13, wherein a third line, separated from the second line by ninety degrees of a polar coordinate system with an origin at the center, crosses at least (n+1) walls and a fourth line, located between the second and third lines, crosses at least n walls.

* * * * *